(12) United States Patent
La Barbera et al.

(10) Patent No.: US 10,755,754 B2
(45) Date of Patent: Aug. 25, 2020

(54) ANALOG METHOD FOR PROGRAMMING A PHASE CHANGE MEMORY CELL BY MEANS OF IDENTICAL ELECTRICAL PULSES

(71) Applicant: COMMISSARIAT A L'ENERGIE ATOMIQUE ET AUX ENERGIES ALTERNATIVES, Paris (FR)

(72) Inventors: Selina La Barbera, Grenoble (FR); Niccolo Castellani, Grenoble (FR); Gabriele Navarro, Grenoble (FR); Elisa Vianello, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/296,834

(22) Filed: Mar. 8, 2019

(65) Prior Publication Data

US 2019/0318781 A1 Oct. 17, 2019

(30) Foreign Application Priority Data

Mar. 9, 2018 (FR) ...................................... 18 52039

(51) Int. Cl.
*G11C 13/00* (2006.01)
*G11C 7/10* (2006.01)

(52) U.S. Cl.
CPC ............ *G11C 7/10* (2013.01); *G11C 13/0004* (2013.01)

(58) Field of Classification Search
CPC ................................................. G11C 13/0004
(Continued)

(56) References Cited

U.S. PATENT DOCUMENTS

| | | | |
|---|---|---|---|
| 2006/0166455 A1 | 7/2006 | Gordon et al. | |
| 2009/0003035 A1 | 1/2009 | Philipp et al. | |
| 2014/0010005 A1* | 1/2014 | Redaelli ................. | G11C 17/14 365/163 |

FOREIGN PATENT DOCUMENTS

| | | |
|---|---|---|
| WO | WO 2013/000940 A1 | 1/2013 |
| WO | WO 2017/184853 A1 | 10/2017 |

OTHER PUBLICATIONS

Search Report as issued in French Patent Application No. 1852039, dated Dec. 13, 2018.

(Continued)

*Primary Examiner* — Jason Lappas
(74) *Attorney, Agent, or Firm* — Pillsbury Winthrop Shaw Pittman LLP

(57) ABSTRACT

A method for programming a phase change memory cell placed in an initial crystalline state, the memory cell being called of taking a plurality of resistance values belonging to a range of values called "programming window", the method including parameterizing a lower limit of the programming window by applying to the memory cell a single gradual writing voltage pulse or a first series of identical gradual writing voltage pulses; progressively adjusting the resistance value of the memory cell by the following operations: a gradual erasing operation during which a series of identical gradual erasing voltage pulses is applied to the memory cell; a gradual writing operation during which a second series of identical gradual writing voltage pulses is applied to the memory cell; the gradual writing and gradual erasing voltage pulses have a width less than 50 ns.

7 Claims, 3 Drawing Sheets

(58) Field of Classification Search
USPC .......................................................... 365/163
See application file for complete search history.

(56) References Cited

OTHER PUBLICATIONS

Kuzum, D., et al., "Nanoelectronic Programmable Synapses Based on Phase Change Materials for Brain-Inspired Computing," Nano Letters, vol. 12, (2012), pp. 2179-2186.
Zhong, Y., et al., "Simple square pulses for implementing spike-timing-dependent plasticity in phase-change memory," Phys. Status Solidi RRL 9, No. 7, pp. 414-419 (2015).
Ambrogio, S., et al., "Unsupervised Learning by Spike Timing Dependent Plasticity in Phase Change Memory (PCM) Synapses," frontiers in Neuroscience, vol. 10, Article 56, Mar. 2016, pp. 1-12.
Suri, M., et al. "Phase Change Memory as Synapse for Ultra-Dense Neuromorphic Systems: Application to Complex Visual Pattern Extraction," IEEE, (2011).
Burr, G. W., et al., "Experimental Demonstration and Tolerancing of a Large-Scale Neural Network (165 000 Synapses) Using Phase-Change Memory as the Synaptic Weight Element," IEEE Transactions on Electron Devices, vol. 62, No. 11, Nov. 2015, pp. 3498-3507.
Eryilmaz, S. B., et al., "Brain-like associative learning using a nanoscale non-volatile phase change synaptic device array," frontier in Neuroscience, vol. 8, Article 205, Jul. 2014, 11 pages.

* cited by examiner

ANALOG METHOD FOR PROGRAMMING A PHASE CHANGE MEMORY CELL BY MEANS OF IDENTICAL ELECTRICAL PULSES

CROSS-REFERENCE TO RELATED APPLICATIONS

This application claims priority to French Patent Application No. 1852039 filed Mar. 9, 2018, the entire content of which is incorporated herein by reference in its entirety.

TECHNICAL FIELD OF THE INVENTION

The present invention relates to a method for programming a phase change memory (PCM) cell.

TECHNOLOGICAL BACKGROUND OF THE INVENTION

A phase change memory cell is an electronic device comprising a phase change material arranged between two electrodes. The phase change material can reversibly pass from an amorphous phase, characterized by a high electrical resistivity, to a crystalline phase, characterized by a low electrical resistivity. The overall resistance of such a memory cell thus depends on the proportion of each of the phases within the phase change material. The transition from the amorphous state to the crystalline state, and vice versa, takes place by applying to the memory cell electrical pulses adapted for each transition from one state to the other.

The performances of phase change memory cells from the point of view of integration capacity, endurance and electrical consumption make them promising candidates for producing artificial synapses intended to connect artificial neurons to each other. It is thereby possible to produce an artificial neural network inspired by the working of the human brain. After a learning phase during which synaptic connections between neurons are created and modified according to a learning rule, the neural network may be used for the detection and the classification of objects and patterns.

A learning rule conventionally used by neural networks is the so-called spike timing dependent plasticity (STDP) rule. It is a biologically inspired rule, the objective of which is to reproduce the learning and memorization mechanisms of biological neurons and synapses.

Generally speaking, synaptic plasticity is the capacity of synapses to modify their force as a function of the use that is made thereof. Synaptic plasticity is based on two phenomena, namely long-term potentiation (LTP) which corresponds to an increase in the synaptic force, and long-term depression (LTD) which corresponds to a decrease in the synaptic force.

To implement the STDP rule, it is necessary that the resistance of the memory cells that model the artificial synapses of the neural network can vary progressively, not just in the sense of increase to simulate long-term depression but also in the sense of decrease to simulate long-term potentiation. To do so, several methods are known in the prior art.

The document KUZUM D. et al., "Nanoelectronic Programmable Synapses Based on Phase Change Materials for Brain-Inspired Computing", Nano Letters 2012, 12 (5), pages 2179-2186, proposes a first method consisting in adapting the amplitude of the pulses applied to the memory cell as a function of the desired change of state. The progressive increase of the resistance of the memory cell is for example obtained by using pulses of which the amplitude increases after each pulse. As for the progressive decrease of the resistance of the memory cell, it may be obtained by using staircase shaped pulses, each step corresponding to an amplitude value for which the pulses are repeated a certain number of times. A drawback of this method is that its implementation is complex from the pulse programming viewpoint.

The document SURI M. et al., "Phase Change Memory as Synapse for Ultra-Dense Neuromorphic Systems: Application to Complex Visual Pattern Extraction", IEEE International Electron Devices Meeting, IEDM 2011, pages 4.4.1-4.4.4, proposes a second method in the form of a circuit solution consisting in using two identical phase change memory cells to form a single synapse. This method is based on the fact that a progressive crystallization of the phase change material may be obtained by applying identical pulses to the memory cell. Thus, by direct mounting a first cell and reverse mounting the second cell, the effects of long-term potentiation may be reproduced by the progressive crystallization of the first memory cell and the effects of long-term depression may be reproduced by the progressive crystallization of the second memory cell. In this case, the programming of the pulses is simplified. However, a drawback of this method it that it requires operations of refreshing the state of the memory cells which are both long and costly from the electrical consumption viewpoint. In addition, this method doubles the number of memory cells necessary to form the synapses of the neural network, which reduces the integration capacity.

SUMMARY OF THE INVENTION

It is clear from the foregoing that there exists a need to improve the programming of a phase change memory cell in order that it changes state progressively, notably with the aim of using the memory cell as artificial synapse in an artificial neural network.

The present invention aims to respond to this need by proposing a method for programming a phase change memory cell placed in an initial crystalline state, the memory cell being capable of taking a plurality of resistance values belonging to a range of values called "programming window", the method comprising the following steps:
  parameterizing a lower limit of the programming window by applying to the memory cell a single gradual writing voltage pulse or a first series of identical gradual writing voltage pulses;
  progressively adjusting the resistance value of the memory cell by means of the following operations:
    a gradual erasing operation during which a series of identical gradual erasing voltage pulses is applied to the memory cell, the gradual erasing voltage pulses being defined so as to lead to a progressive increase in the resistance value of the memory cell;
    a gradual writing operation during which a second series of identical gradual writing voltage pulses is applied to the memory cell, the gradual writing voltage pulses being defined so as to lead to a progressive decrease in the resistance value of the memory cell;
  the gradual writing and gradual erasing voltage pulses having a width less than 50 ns.

The present invention makes it possible to program, that is to say to modify the resistance of the phase change memory cell, by means of identical electrical pulses. The programming of the memory cell is thereby simplified. In the context of the invention, the voltage pulses are defined by characteristic parameters such that the memory cell is passed through by an electrical current belonging to a non-stationary regime which enables the phase change material of the memory cell to pass progressively from a crystalline state to an amorphous state, and vice versa. In the non-stationary regime, the electrical current passing through the memory cell does not have the time to reach its maximum value.

The method according to the invention may also comprise one or more characteristics among the following, considered individually or according to all technically possible combinations thereof.

According to an embodiment, the memory cell is placed in the initial crystalline state during an initialization step, the gradual writing and gradual erasing voltage pulses being defined by an amplitude and a width determined during the initialization step.

According to an embodiment, the memory cell reaches an entirely erased state during the initialization step when voltage pulses having a so-called "total erasing" amplitude are applied to the memory cell, the gradual writing and gradual erasing voltage pulses each having an amplitude less than the total erasing amplitude.

According to an embodiment, the amplitude of the gradual writing voltage pulses satisfies the following relationship:

$$V_{melt} + \frac{5}{100}(V_{RESET\_tot} - V_{melt}) \leq$$
$$V_{SET\_grad} \leq V_{melt} + \frac{30}{100}(V_{RESET\_tot} - V_{melt})$$

where $V_{melt}$ is an amorphization beginning voltage and $V_{RESET\_tot}$ is the total erasing amplitude.

According to an embodiment, the amplitude of the gradual erasing voltage pulses satisfies the following relationship:

$$V_{melt} + \frac{60}{100}(V_{RESET\_tot} - V_{melt}) \leq$$
$$V_{RESET\_grad} \leq V_{melt} + \frac{80}{100}(V_{RESET\_tot} - V_{melt})$$

where $V_{melt}$ is an amorphization beginning voltage and $V_{RESET\_tot}$ is the total erasing voltage.

According to an embodiment, the lower limit of the programming window is comprised between 15 kΩ and 30 kΩ.

According to an embodiment, the memory cell comprises a chalcogenide-based or a chalcogenide alloy-based phase change material.

BRIEF DESCRIPTION OF THE FIGURES

The invention and its different applications will be better understood on reading the description that follows and by examining the figures that accompany it, among which.

The figures are only presented for indicative purposes and in no way limit the invention.

For greater clarity, identical or similar elements are marked by identical reference signs in all of the figures.

DETAILED DESCRIPTION OF EMBODIMENTS OF THE INVENTION

Figure 1:
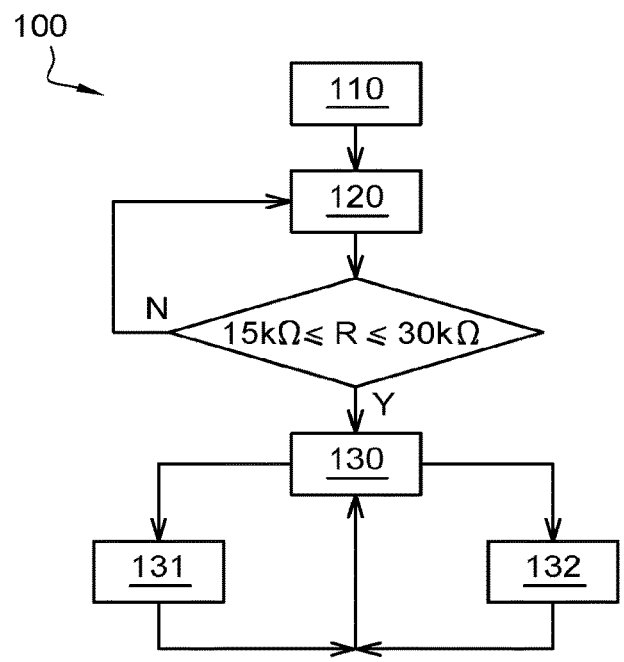
FIG. 1 is a functional diagram of an embodiment of the method according to the invention.

FIG. 1 shows a method for programming 100 a phase change memory cell, according to an embodiment of the invention. A phase change memory cell is an electronic device comprising a phase change material arranged between a lower electrode and an upper electrode.

The memory cell has an electrical resistance that depends on the state in which the phase change material finds itself. Indeed, the phase change material is capable of reversibly switching between an amorphous state characterized by a high electrical resistivity and a crystalline state characterized by a low electrical resistivity. Consequently, the resistance of the memory cell is a function of the degree of crystallization of the phase change material. Stated otherwise, the larger the crystallized zone of the phase change material, the lower the resistance of the memory cell. Vice versa, the larger the amorphous zone of the phase change material, the higher the resistance of the memory cell.

The phase change material passes from the amorphous state to the crystalline state, and vice versa, when electrical pulses, for example of rectangular shape, are applied to the memory cell. The phase change material is preferentially a chalcogenide-based or a chalcogenide alloy-based material such as $Ge_2Sb_2Te_5$ (GST) or GeTe. However, the phase change material may be any material capable of changing phase reversibly by mean of an electrical current passing between the two electrodes.

Throughout the description and in the claims, the voltage pulses defined so as to enable the phase change material to pass progressively from the amorphous state to the crystalline state are called "gradual writing voltage pulses" and the voltage pulses defined so as to enable the phase change material to pass progressively from the crystalline state to the amorphous state are called "gradual erasing voltage pulses".

In operation, all of the resistance values that the memory cell can take defines a programming window. It is a range of values comprising a lower limit and an upper limit between which extend a multitude of intermediate resistance values which correspond to different proportions of amorphous and crystalline phases of the phase change material. In other words, the memory cell can take any resistance value situated in the programming window.

The programming method 100 comprises a step of parameterizing 120 the lower limit $R_1$ of the programming window. To do so, a single gradual (or partial) writing voltage pulse may be applied to the memory cell so as to form an amorphous zone of limited extent in the phase change material. Depending on the initial resistance of the memory cell, the lower limit $R_1$ of the programming window may be parameterized by applying a first identical series of gradual (or partial) writing voltage pulses. The first series of pulses comprises a number of pulses adapted to reach the resistance value $R_1$. This number depends notably on the amplitude of the pulses and on the structure of the memory cell. Preferably, the lower limit $R_1$ of the programming window is comprised between 15 kΩ and 30 kΩ. In this case, the amorphous zone thereby created covers a part only of the contact surface between the phase change material and the lower electrode of the memory cell.

Throughout the description and in the claims, "identical pulses" is taken to mean pulses delivered by a same power source which is configured in the same way for each pulse, these pulses thus being assumed to be identical, or at the very least similar, from the point of view of their characteristic parameters such as their amplitude and their width (i.e. duration).

In an embodiment of the parameterizing step 120, the partial amorphization of the phase change material is obtained by applying to the memory cell a single pulse having an amplitude which decreases in a continuous manner (in other words a pulse in the form of a continuous ramp) or a series of pulses of decreasing amplitude. The phase change material is thereby entirely amorphized then partially recrystallized. In an alternative embodiment, a series of pulses of increasing amplitude is applied from an entirely crystallized state, which makes it possible to amorphize gradually the material until the desired resistance $R_1$ is obtained.

The upper limit $R_{MAX}$ of the programming window corresponds to the maximum value that the resistance of the memory cell can take with analog switching, that is to say a progressive transition from one state to the other.

The parameterizing step 120 is advantageously carried out when the memory cell is in an initial crystalline state. However, after its manufacture, the memory cell is in a virgin state. In this virgin state, the phase change material is in an unknown state which notably depends on the manufacturing method and the materials used. The degree of crystallization is not a priori known. The memory cell is thus advantageously placed in the initial crystalline state before the parameterizing step 120 during an initialization step 110. It is thereby possible to obtain a known reference state. In the initial crystalline state, the memory cell has a minimum resistance $R_0$, for example less than 10 kΩ. The initial crystalline state is for example reached when the phase change material is entirely crystallized. There then results from the parameterizing step 120 an increase in the resistance of the memory cell until the resistance value $R_1$ (15-35 kΩ) is reached.

After the parameterizing step 120, the programming method 100 comprises a step of progressive adjustment 130 of the resistance value of the memory cell. This adjustment step 130 comprises the following two operations, which can be carried out successively (that is to say one after the other) and in any order (random sequencing).

A first so-called "gradual erasing operation" 131 consists in applying to the memory cell a series of identical gradual erasing voltage pulses. Under the effect of these pulses, the phase change material sees its degree of crystallization decrease progressively. The result is a progressive increase in the resistance of the memory cell. The resistance can increase until it reaches the upper limit $R_{MAX}$ of the programming window if the number of gradual erasing voltage pulses is sufficiently large (cf. FIG. 4).

Conversely, a second so-called "gradual writing operation" 132 consists in applying to the memory cell a second series of identical gradual writing voltage pulses. Under the effect of these pulses, the phase change material sees its degree of crystallization progressively increase. The result is a progressive decrease in the resistance of the memory cell. The resistance can decrease until it reaches the lower limit $R_1$ of the programming window if the number of gradual writing voltage pulses is sufficiently large (cf. FIG. 4).

The initialization step 110 is preferably carried out by applying to the memory cell voltage pulses having a rectangular shape and an amplitude that increases then decreases, for example after each pulse, with a predetermined pitch. Such a programming of pulses is known as staircase programming, with reference to the shape of the pulses.

The gradual erasing and gradual writing voltage pulses that are applied to the memory cell have characteristic parameters (duration, amplitude) such that the state of the phase change material is modified progressively. Advantageously, the characteristic parameters of these voltage pulses are defined during the initialization step 110. This determination only needs to be accomplished once to characterize the stack of the phase change memory cell. Once the characteristic parameters of the gradual erasing and gradual writing voltage pulses for a stack have been determined, all the memory cells comprising this same stack may be programmed by means of steps 120 and 130 only. The width of the gradual writing voltage pulses is preferably equal to the width of the gradual erasing voltage pulses.

Figure 2:
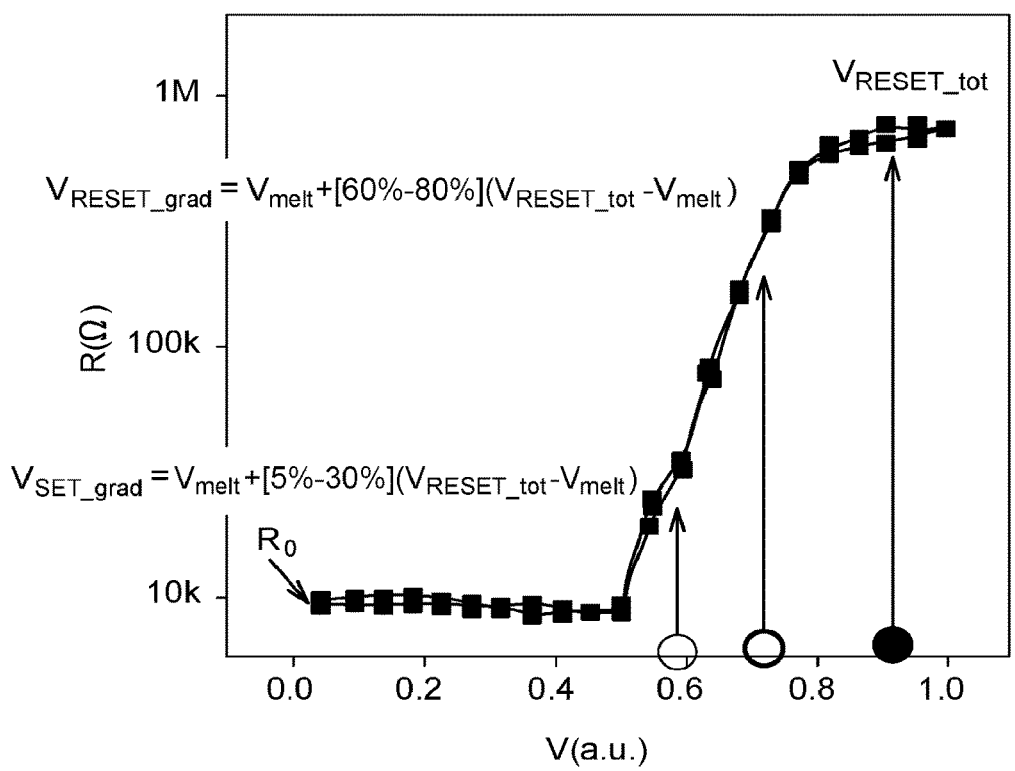
FIG. 2 represents a characteristic curve of the resistance as a function of the amplitude of the voltage pulses applied to a memory cell.

FIG. 2 shows an example of characteristic curve of the resistance of the memory cell as a function of the amplitude of the voltage pulses applied to the memory cell, in the case of a staircase programming as described previously. In this example, the pulses have a width of 500 ns and an amplitude which increases then decreases. The size of the amorphous zone, and consequently the resistance value R, increases with the amplitude V of the pulses until the entirely erased state is reached for a total erasing amplitude $V_{RESET\_tot}$ then decreases until the entirely crystallized state ($R_0$) is reached.

From the curve of FIG. 2, it is possible to define the amplitude of the voltage pulses to apply to the memory cell to progressively modify the resistance value at the adjustment step 130. Advantageously, the amplitude of the voltage pulses is less than the total erasing amplitude $V_{RESET\_tot}$ so as to limit the electrical current density passing through the memory cell, and thus the temperature, in order to cause a progressive modification of the state of the phase change material.

Preferably, the gradual writing voltage pulses have a gradual writing amplitude $V_{SET\_grad}$ such that:

$$V_{melt} + \frac{5}{100}(V_{RESET\_tot} - V_{melt}) \leq V_{SET\_grad} \leq V_{melt} + \frac{30}{100}(V_{RESET\_tot} - V_{melt})$$

where $V_{melt}$ is an amorphization beginning voltage, that is to say the voltage from which the phase change material begins to amorphize, and $V_{RESET\_tot}$ is the total erasing voltage. The amorphization beginning voltage $V_{melt}$ may be determined from the step 120 (FIG. 2). It is the voltage at which an increase in the resistance starts to be seen.

If a zero amorphization beginning voltage $V_{melt}$ is considered, then the amplitude $V_{SET\_grad}$ of the gradual writing voltage pulses is comprised between 5% and 30% of the total erasing amplitude $V_{RESET\_tot}$.

Preferably, the gradual erasing voltage pulses have a gradual erasing amplitude $V_{RESET\_grad}$ such that:

$$V_{melt} + \frac{60}{100}(V_{RESET\_tot} - V_{melt}) \leq$$
$$V_{RESET\_grad} \leq V_{melt} + \frac{80}{100}(V_{RESET\_tot} - V_{melt})$$

If a zero amorphization beginning voltage $V_{melt}$ is considered, then the amplitude $V_{RESET\_grad}$ of the gradual erasing voltage pulses is comprised between 60% and 80% of the total erasing amplitude $V_{RESET\_tot}$.

In the example of FIG. 2, the amorphization beginning voltage $V_{melt}$ is equal to around 0.5 a.u. (arbitrary units) and the total erasing amplitude $V_{RESET\_tot}$ is equal to around 0.9 a.u. The gradual writing amplitude $V_{SET\_grad}$ is then comprised between around 0.52 a.u. and 0.62 a.u. and the gradual erasing amplitude $V_{RESET\_grad}$ is then comprised between around 0.74 a.u. and 0.82 a.u.

Figure 3:
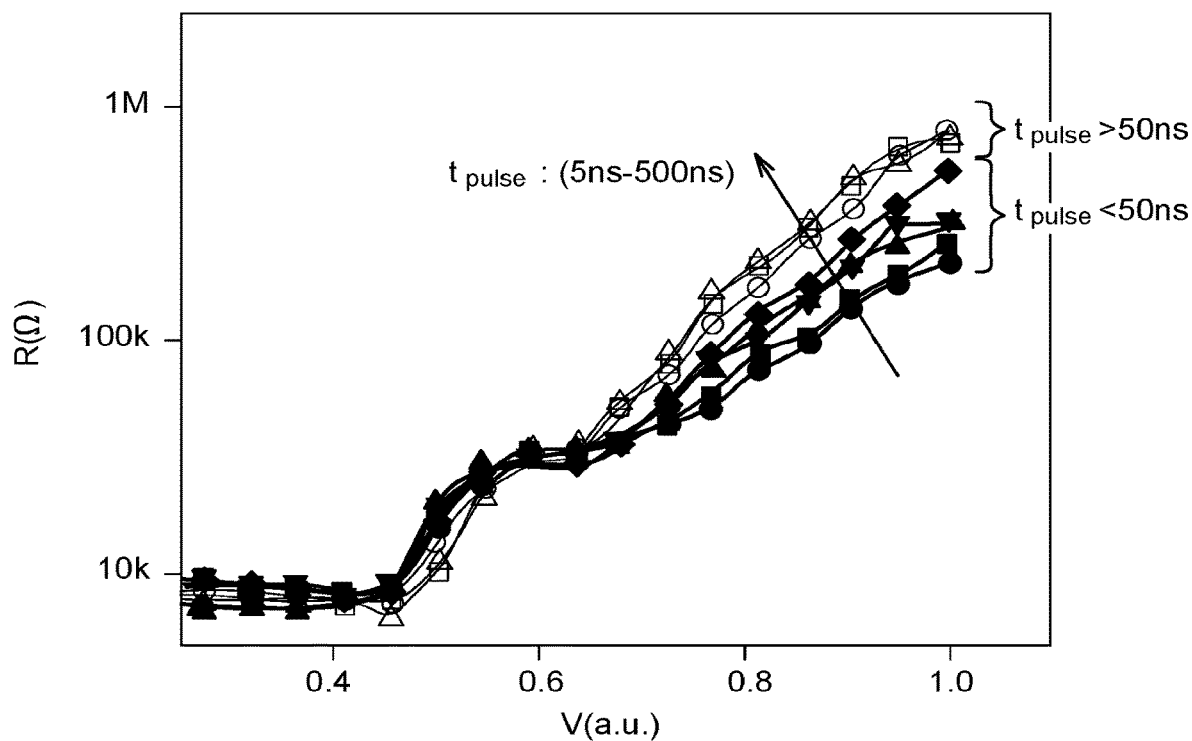
FIG. 3 represents characteristic curves of the resistance as a function of the amplitude of the voltage pulses applied to the memory cell of FIG. 2, for different pulse widths or durations.

FIG. 3 shows the influence of the width or duration $t_{pulse}$ of the voltage pulses on the transition from the crystalline state to the amorphous state of the phase change material with a staircase programming of the memory cell. In this example, when the width $t_{pulse}$ of the voltage pulses is greater than 50 ns, the current passing through the memory cell is in a stationary regime and the resistance of the memory cell is independent of the width $t_{pulse}$ of the pulses. On the other hand, when the width $t_{pulse}$ of the pulses is less than 50 ns, the current does not have the time to reach the stationary regime and the resistance of the memory cell depends on the width $t_{pulse}$ of the pulses. Consequently, the width of the gradual writing and gradual erasing voltage pulses is advantageously less than 50 ns in order to make progressive modifications of the state of the phase change material possible. The variation in resistance of the memory cell at each gradual writing or gradual erasing voltage pulse depends on the width of the pulses.

Figure 4:
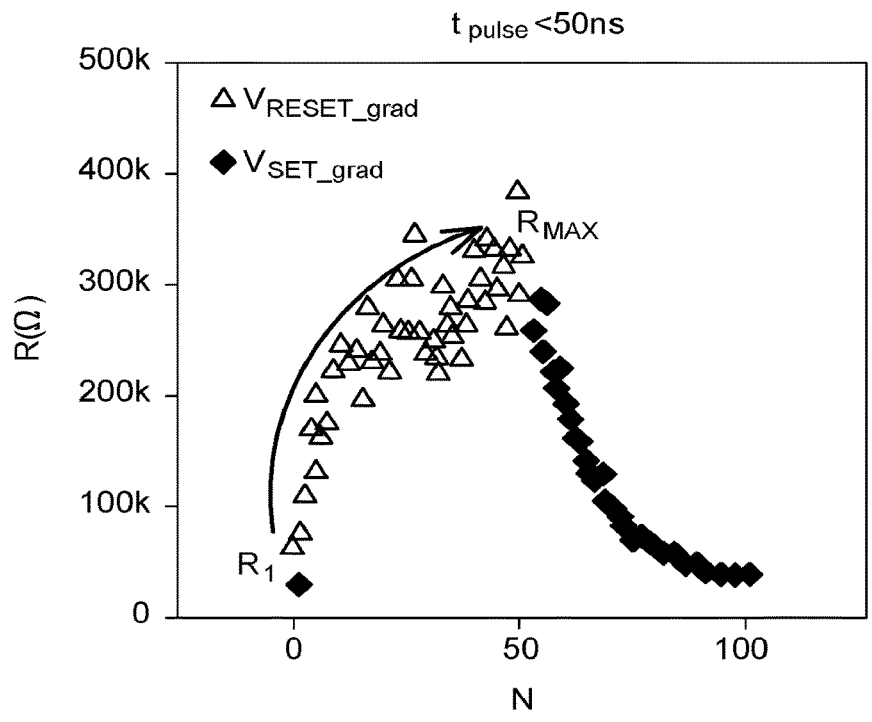
FIG. 4 represents a variation curve of the resistance as a function of the amplitude and the number of voltage pulses applied to the memory cell of FIG. 2.

Thanks to the invention, the resistance of the memory cell may be adjusted progressively using identical pulses, which simplifies programming. The phase change material may have different crystallization stages each corresponding to a resistance value. The transition from the amorphous state to the crystalline state, and vice versa, thus takes place in an analog manner such as illustrated in FIG. 4, as opposed to a binary behavior only resulting in one high resistance amorphous state and one low resistance crystalline state. The resistance of the memory cell tends towards the lower limit $R_1$ by applying pulses of amplitude $V_{SET\_grad}$ and tends towards the upper limit $R_{max}$ by applying pulses of amplitude $V_{RESET\_grad}$.

Such an analog behavior makes it possible to implement an unsupervised learning phase, also known as "on-line learning" phase, using the phase change memory cell as synapse in an artificial neural network. During an on-line learning phase, each synaptic resistance is determined in situ, which makes it possible to model the long-term potentiation (LTP) and the long-term depression (LTD).

It should be noted that binary behavior may be obtained when the electrical current passing through the memory cell is in a stationary regime, that is to say when the width of the voltage pulses is for example greater than 50 ns.

In a preferential embodiment of the programming method, the voltage pulse (or the series of identical voltage pulses) applied at the parameterizing step 120 has an amplitude equal to the gradual writing amplitude $V_{SET\_grad}$ (applied during the second operation 132). Only two amplitudes, $V_{SET\_grad}$ and $V_{RESET\_grad}$, are then used, which even further simplifies the programming of the memory cell.

Figure 5:
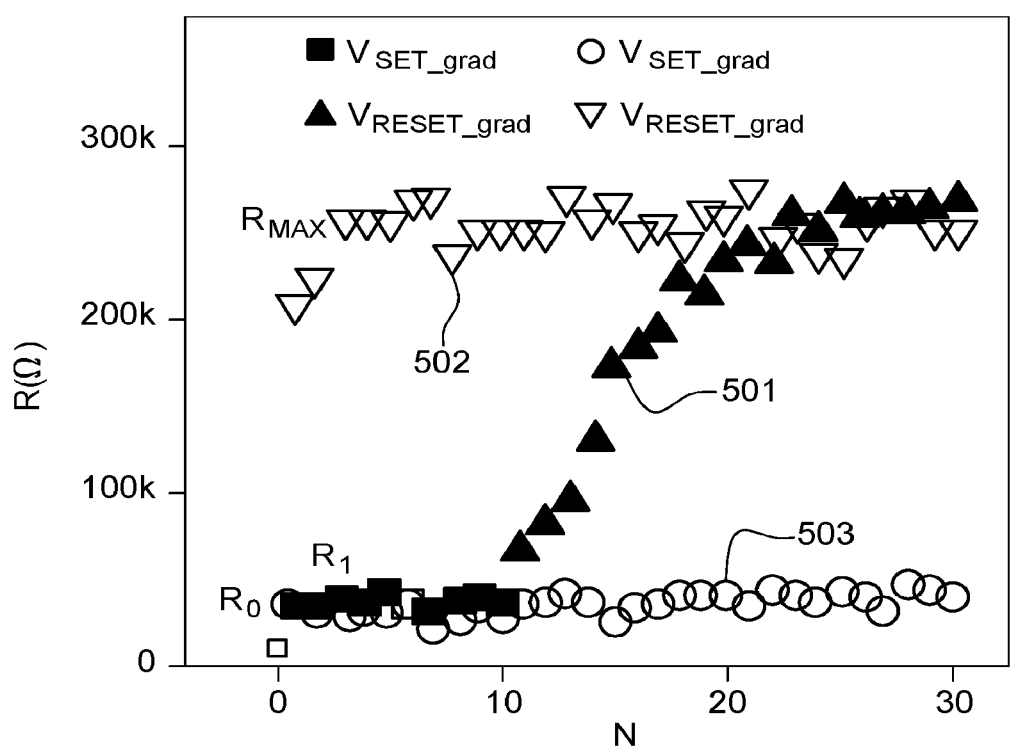
FIG. 5 represents the variation curves of the resistance as a function of the amplitude and the number of voltage pulses applied to the memory cell of FIG. 2, for three different pulse sequences.

FIG. 5 illustrates the comparison between three sequences of pulses used to program the memory cell. A first sequence 501 applied to the memory cell is a sequence according to the invention and comprises 10 identical gradual writing pulses ($V=V_{SET\_grad}$) followed by 20 identical gradual erasing pulses ($V=V_{RESET\_grad}$). It is thereby possible to observe the progressive increase of the resistance of the memory cell, firstly from the initial resistance $R_0$ to the lower limit $R_1$ of the programming window, then from the lower limit $R_1$ to the upper limit $R_{max}$ of the programming window. Conversely, when a second sequence 502 comprising only gradual erasing pulses ($V=V_{RESET\_grad}$), in this case 30 in number, is applied to the memory cell, it is possible to observe an abrupt transition from the initial crystalline state ($R_0$) to the amorphous state ($R_{Max}$). When a third sequence 503 comprising only gradual writing pulses ($V_{SET\_grad}$), in this case 30 in number, is applied to the memory cell, the gradual writing amplitude $V_{SET\_grad}$ is not sufficient to induce a change of resistance state beyond the lower limit $R_1$ of the programming window.

In the memory cell of FIGS. 2 to 5, the phase change material is a chalcogenide alloy having the formula $Ge_2Sb_2Te_5$ (GST) and has a thickness of 50 nm.

Of course, the invention is not limited to the embodiments described with reference to the figures and alternatives could be envisaged without going beyond the scope of the invention.

The invention claimed is:

1. A method for programming a phase change memory cell placed in an initial crystalline state, the memory cell being capable of taking a plurality of resistance values belonging to a range of values forming a programming window, the method comprising:
    parameterizing a lower limit of the programming window by applying to the memory cell a single gradual writing voltage pulse or a first series of identical gradual writing voltage pulses;
    progressively adjusting the resistance value of the memory cell by means of the following operations:
      a gradual erasing operation during which a series of identical gradual erasing voltage pulses is applied to the memory cell, the gradual erasing voltage pulses being defined so as to lead to a progressive increase in the resistance value of the memory cell;
      a gradual writing operation during which a second series of identical gradual writing voltage pulses is applied to the memory cell, the gradual writing voltage pulses being defined so as to lead to a progressive decrease in the resistance value of the memory cell;
    the gradual writing and gradual erasing voltage pulses having a width less than 50 ns.

2. The programming method according to claim 1, wherein the memory cell is placed in the initial crystalline state during an initialisation step, the gradual writing and gradual erasing voltage pulses being defined by an amplitude and a width determined during the initialisation step.

3. The programming method according to claim 2, wherein the memory cell reaches an entirely erased state during the initialisation step when voltage pulses having a total erasing amplitude are applied to the memory cell, the gradual writing and gradual erasing voltage pulses each having an amplitude less than the total erasing amplitude.

4. The programming method according to claim 3, wherein the amplitude ($V_{SET\_grad}$) of the gradual writing voltage pulses satisfies the following relationship:

$$V_{melt} + \frac{5}{100}(V_{RESET\_tot} - V_{melt}) \leq$$
$$V_{SET\_grad} \leq V_{melt} + \frac{30}{100}(V_{RESET\_tot} - V_{melt})$$

where $V_{melt}$ is an amorphization beginning voltage and $V_{RESET\_tot}$ is the total erasing amplitude.

5. The programming method according to claim 3, wherein the amplitude ($V_{RESET\_grad}$) of the gradual erasing voltage pulses satisfies the following relationship:

$$V_{melt} + \frac{60}{100}(V_{RESET\_tot} - V_{melt}) \leq$$
$$V_{RESET\_grad} \leq V_{melt} + \frac{80}{100}(V_{RESET\_tot} - V_{melt})$$

where $V_{melt}$ is an amorphization beginning voltage and $V_{RESET\_tot}$ is the total erasing amplitude.

6. The programming method according to claim 1, wherein the lower limit of the programming window is comprised between 15 kΩ and 30 kΩ.

7. The programming method according to claim 1, wherein the memory cell comprises a chalcogenide-based or a chalcogenide alloy-based phase change material.

* * * * *